(12) United States Patent
Nakao et al.

(10) Patent No.: US 10,707,341 B2
(45) Date of Patent: Jul. 7, 2020

(54) SEMICONDUCTOR DEVICE

(71) Applicant: Mitsubishi Electric Corporation, Tokyo (JP)

(72) Inventors: Yukiyasu Nakao, Tokyo (JP); Kohei Ebihara, Tokyo (JP); Shiro Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/316,082

(22) PCT Filed: Jun. 26, 2017

(86) PCT No.: PCT/JP2017/023349
§ 371 (c)(1),
(2) Date: Jan. 8, 2019

(87) PCT Pub. No.: WO2018/037701
PCT Pub. Date: Mar. 1, 2018

(65) Prior Publication Data
US 2020/0185517 A1  Jun. 11, 2020

(30) Foreign Application Priority Data

Aug. 25, 2016  (JP) ................................ 2012-164480

(51) Int. Cl.
*H01L 29/78* (2006.01)
*H01L 29/47* (2006.01)
*H01L 29/16* (2006.01)

(52) U.S. Cl.
CPC ...... *H01L 29/7806* (2013.01); *H01L 29/1608* (2013.01); *H01L 29/47* (2013.01)

(58) Field of Classification Search
CPC .. H01L 29/7806; H01L 29/47; H01L 29/1608
See application file for complete search history.

(56) References Cited

U.S. PATENT DOCUMENTS

2003/0080355 A1  5/2003  Shirai et al.
2011/0278599 A1  11/2011  Nakao et al.
(Continued)

FOREIGN PATENT DOCUMENTS

JP  2003-17701 A  1/2003
JP  2003-133557 A  5/2003
(Continued)

OTHER PUBLICATIONS

International Search Report dated Aug. 29, 2017, in PCT/JP2017/023349, filed Jun. 26, 2017.

*Primary Examiner* — Yasser A Abdelaziez
(74) *Attorney, Agent, or Firm* — Xsensus LLP

(57) ABSTRACT

A semiconductor device includes: a plurality of semiconductor switching elements that are a plurality of MOSFETs each including a Schottky barrier diode; a first ohmic electrode disposed above a first region of a well region and electrically connected to the first region, the first region being on the opposite side from a predefined region; a first Schottky electrode disposed on a semiconductor layer exposed at the first region of the well region; and a line electrically connected to the first ohmic electrode, the first Schottky electrode, and a source electrode. The device enables reduction of a breakdown in a gate insulating film.

12 Claims, 8 Drawing Sheets

(56) References Cited

U.S. PATENT DOCUMENTS

| | | | |
|---|---|---|---|
| 2012/0298994 A1* | 11/2012 | Sawada | H01L 29/42372 |
| | | | 257/48 |
| 2015/0349051 A1 | 12/2015 | Uchida et al. | |
| 2016/0079411 A1 | 3/2016 | Hino et al. | |
| 2017/0077087 A1 | 3/2017 | Horikawa et al. | |
| 2018/0097103 A1* | 4/2018 | Sadamatsu | H01L 22/32 |
| 2019/0181259 A1* | 6/2019 | Hino | H01L 27/095 |

FOREIGN PATENT DOCUMENTS

| JP | 2014-38963 A | 2/2014 |
|---|---|---|
| JP | 2016-6854 A | 1/2016 |
| WO | WO 2010/098294 A1 | 9/2010 |
| WO | WO 2014/162969 A1 | 10/2014 |
| WO | WO 2015/178024 A1 | 11/2015 |

\* cited by examiner

SEMICONDUCTOR DEVICE

TECHNICAL FIELD

The present invention relates to a semiconductor device.

BACKGROUND ART

Some semiconductor devices such as a metal-oxide-semiconductor field-effect-transistor (MOSFET) include freewheeling diodes. For example, Patent Documents 1 to 3 each propose a structure of including a Schottky barrier diode (SBD) in a MOSFET unit to be applied as a freewheeling diode. Moreover, a structure of placing a low-resistance layer in a well with a large area is proposed as a structure for increasing reliability in high-speed switching in a SiC-MOS structure as described in Patent Document 4.

PRIOR ART DOCUMENTS

Patent Documents

Patent Document 1: Japanese Patent Application Laid-Open No. 2003-017701
Patent Document 2: WO2014/162969
Patent Document 3: Japanese Patent Application Laid-Open No. 2003-133557
Patent Document 4: WO2010/098294

SUMMARY

Problem to be Solved by the Invention

Generally, semiconductor devices such as MOSFETs include p-n diodes. Upon operation of a p-n diode, minority carriers are injected into a drift layer.

In the semiconductor devices, the injected minority carriers are recombined with majority carriers in the drift layer. It is known that depending on the type of the semiconductor, the recombination energy generated then disturbs the periodic structure of crystals, that is, crystal defects occur. Particularly, the crystal structure of silicon carbide is easily changed. This is because the energy to be released in recombination is large as silicon carbide has a large bandgap, and silicon carbide has various stable crystalline phases. Thus, upon operation of a p-n diode included in a silicon carbide semiconductor device, crystal defects easily occur.

When the crystal defects occur, the electrical resistance increases. When the recombination causes the crystal defects in a region including unit cells where a channel is formed with application of a voltage, particularly in an active region of MOSFETs, the ON resistance, that is, the element resistance to a forward current between the source and the drain increases. As a result, the conduction loss increases upon energization at the same current density.

As the conduction loss that is one of the dominant losses increases in the MOSFET, the heat generated in the MOSFET also increases, thus causing a problem of making a long-term stable operation difficult.

On the other hand, designing a SBD, in a MOSFET including the SBD, lower in diffusion potential than a p-n junction allows a unipolar current to flow through the included SBD until the operation of the p-n diode in the active region in a freewheeling operation. Thus, in regard to a fixed amount of current, a freewheeling current can be passed with no operation of the p-n diode, which can avoid increase in the ON resistance.

However, the termination layout described in Patent Document 1 produces a problem of causing, among a group of unit cells of MOSFETs, a unit cell disposed in a region close to a termination portion to operate earlier than the other unit cells, that is, causing a p-n diode to operate with application of a low source-to-drain voltage, as the freewheeling current flowing through the MOSFETs increases.

Here, the semiconductor device continues to be used for a long time under the use condition beyond a planned voltage. This results in problems with increase in the ON resistance in unit cells close to an outer periphery and also increase in the ON resistance in the whole chip.

Suppressing increase in the ON resistance in the whole chip less than or equal to the tolerance requires limiting the freewheeling current flowing through the whole elements and limiting the current flowing through the p-n diode in the unit cell disposed in the region close to the termination portion. This means necessity of increasing the chip size to allow a desired current to flow, and thus means increase in the cost of chips.

In contrast, a SBD is disposed in a well region close to a unit cell in a termination portion according to a technology of Patent Document 2. Such a technology enables reduction in operations of the unit cell disposed in the region close to the termination portion and p-n diodes disposed in the well region in the termination portion. However, as the well region in a termination region is enlarged by, for example, disposing a gate line in the well region in the termination region, a p-n diode in a portion distant from the region including the SBD operates earlier. This sometimes results in the recombination due to diffusion of the injected minority carriers into a unit cell region, and degradation of the ON resistance.

According to a technology of Patent Document 3, SBDs are disposed in a region outside a gate line. However, the SBDs are merely simply disposed over the region without any space in-between. An ohmic resistor in a well region disposed under the gate line is not disposed in the region outside the gate line. Thus, the potential greatly fluctuates with a displacement current generated in switching operations. The fluctuation boosts the potential of well under a gate line portion, thus sometimes causing a breakdown in a gate oxide film.

This phenomenon will be hereinafter described in detail. When a MOSFET cell that is a switching element is switched from an ON state to an OFF state, the drain voltage of the MOSFET cell, that is, a voltage of a drain electrode suddenly rises approximately from 0 V to several hundred voltages. Then, the displacement current flows from a drain layer to a well through a parasitic capacitor between the well and the drain layer. This displacement current flows through a source electrode in the same manner, even in a well of a MOSFET cell, in a well of a diode cell, and in a well under a gate pad.

It is to be noted that the well under the gate pad is much larger in area than the well of the MOSFET cell and the well of the diode cell. Since a contact hole includes a resistor as well as the well itself, flow of the displacement current through the well under the gate pad that is much larger in area causes a potential drop across the well that is not negligible in value. As a result, a portion at a great horizontal distance from a portion (contact hole) electrically connected to a source electrode through a field plate in a well has a relatively large potential. This potential increases as fluctuations $dV/dt$ of the drain voltage V with time t are greater.

In a structure of placing, through a gate insulating film, a gate electrode at a portion of the well under the gate pad that is distant from the contact hole, immediately after the MOSFET cell is switched from the ON state to the OFF state, application of an increased electric field to the gate insulating film between the gate electrode having a voltage close to 0 V and the well under the gate pad distant from the contact hole sometimes causes a breakdown in the gate insulating film. A technology of Patent Document 4 adopts a structure for forming a $p^{++}$ layer close to a well surface to reduce the resistance in a well layer as a means for avoiding the breakdown. However, the structure in which the resistance in the well layer is reduced produces a problem of causing a large amount of current to flow when the p-n diode disposed in the well region of the termination portion operates.

Thus, the present invention has been conceived in view of the problems, and has an object of providing a technology capable of reducing the chip size and the cost of chips accordingly by increasing a value of a current flowing through the whole chip until the p-n diode formed in the well region of the termination portion operates, without breaking down the gate insulating film.

Means to Solve the Problem

A semiconductor device according to the present invention includes: a semiconductor layer of a first conductivity type; a plurality of semiconductor switching elements disposed in a predefined region, in the semiconductor layer, the plurality of semiconductor switching elements being a plurality of metal-oxide-semiconductor field-effect-transistors (MOSFETs) including a source electrode and a gate electrode that are disposed above the predefined region, the plurality of semiconductor switching elements each including a Schottky barrier diode; a well region of a second conductivity type that is disposed separate from the predefined region in a plan view, the well region being included in a surface layer of the semiconductor layer; a gate line disposed above the well region and electrically connected to the gate electrode; a first ohmic electrode disposed above a first region of the well region and electrically connected to the first region, the first region being on the opposite side from the predefined region; a first Schottky electrode disposed on the semiconductor layer exposed at the first region of the well region; and a line electrically connected to the first ohmic electrode, the first Schottky electrode, and the source electrode.

Effects of the Invention

The present invention provides: a first ohmic electrode disposed above a first region of the well region and electrically connected to the first region, the first region being on the opposite side from the predefined region; a first Schottky electrode disposed on the semiconductor layer exposed at the first region of the well region; and a line electrically connected to the first ohmic electrode, the first Schottky electrode, and the source electrode. This structure provides the first Schottky electrode on the first region, thus creating a voltage drop in the first Schottky electrode in a freewheeling state. Further, voltages to be applied to the well region in the predefined region and to the Schottky barrier diodes included therein are relaxed. Since operations of a p-n diode can be reduced, a larger amount of current can be freewheeled in the Schottky barrier diodes. Formation of the first ohmic electrode can suppress rise in the potential in a gate line region without reducing the resistance of a well, and reduce a breakdown in a gate insulating film on the gate line region. Since the resistance of the well region is not reduced, the current value can be reduced even with the operations of the p-n diode. Since the freewheeling current that can flow through the whole chip with the unipolar current increases, the chip size can be reduced.

The objects, features, aspects and advantages of the present invention will become more apparent from the following detailed description and the accompanying drawings.

DESCRIPTION OF EMBODIMENTS

Embodiments of the present invention will be hereinafter described with reference to the attached drawings. The following Embodiments will describe a silicon carbide (SiC) semiconductor device as one example semiconductor device, particularly, an n-channel silicon carbide MOSFET whose first conductivity type is n-type and whose second conductivity type is p-type as one example.

Embodiment 1

[Structure]

Figure 1:
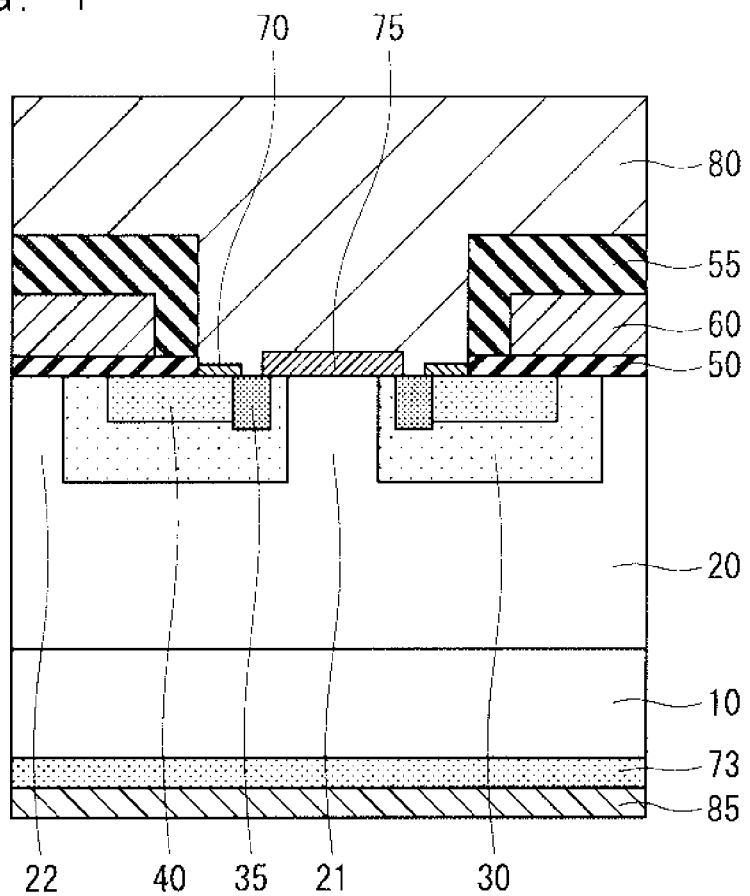
FIG. 1 is a schematic cross-sectional view illustrating a structure of a unit cell included in a semiconductor device according to Embodiment 1.
Figure 2:
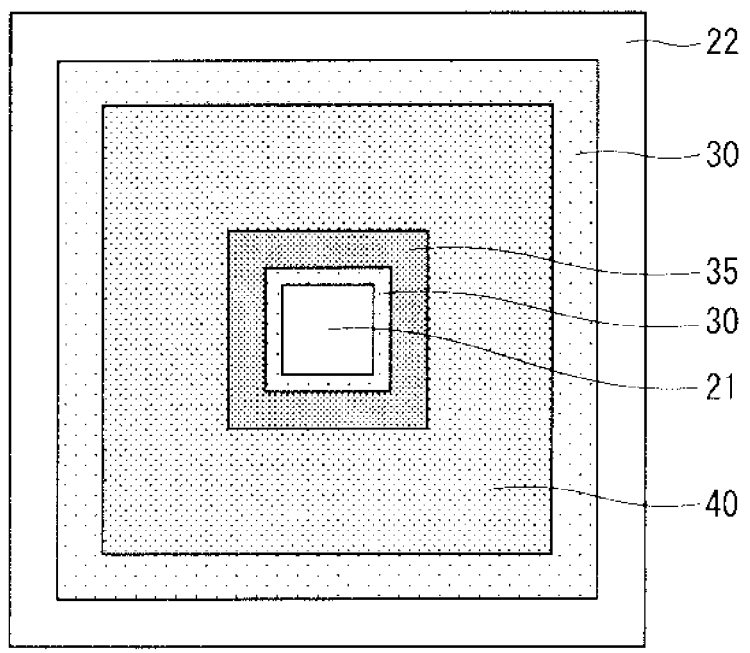
FIG. 2 is a schematic plan view illustrating the structure of the unit cell included in the semiconductor device according to Embodiment 1.

First, a structure of a semiconductor device according to Embodiment 1 will be described. FIG. 1 is a schematic cross-sectional view illustrating a structure of a unit cell included in the semiconductor device. FIG. 2 is a schematic plan view that is an elevated view of the unit cell illustrated in FIG. 1 from above. FIG. 2 omits the illustration of, for example, electrodes and insulating films in FIG. 1, and only represents each region formed in a semiconductor layer.

As illustrated in FIG. 1, the unit cell includes an n-type substrate 10 having a 4H polytype and made of silicon carbide with low resistance. In Embodiment 1, the first main surface of the substrate 10 in one plane direction is a (0001) plane, and is inclined 4° with respect to a c-axis direction that is not illustrated.

A drift layer 20 that is an n-type semiconductor layer and is a silicon carbide layer is disposed on the first main surface of the substrate 10. The unit cell illustrated in FIGS. 1 and 2 is disposed in a plurality of portions in an active region that is a predefined region, in this drift layer 20.

A cell-side well region 30 of p-type containing p-type impurities, for example, aluminum (Al) is partially disposed in a surface layer of the drift layer 20. As illustrated in FIG. 2, the cell-side well region 30 is ring-shaped in a plan view according to Embodiment 1. Since the plurality of unit cells are disposed in the active region of the drift layer 20 as described above, a plurality of the cell-side well regions 30 are disposed in the drift layer 20. In the drift layer 20, a surface layer portion that separates the adjacent cell-side well regions 30 is an n-type region referred to as a second separating region 22.

One of the cell-side well regions 30 ring-shaped in a plan view in FIG. 2 is separated by the surface layer portion of the drift layer 20 into two in a cross-sectional view of FIG. 1. In the drift layer 20, the surface layer portion that separates one of the cell-side well regions 30 into two in a cross-sectional view, that is, the surface layer portion that penetrates from the surface layer of the cell-side well region 30 into a depth direction is an n-type region referred to as a first separating region 21. This first separating region 21 is a region located directly underneath a Schottky electrode 75 to be described later. The first separating region 21 and a second separating region 22 are, for example, regions as deep as the cell-side well regions 30 with respect to the surface of the drift layer 20.

A source region 40 of n-type containing n-type impurities, for example, nitrogen (N) is disposed partially in the surface layer of the cell-side well region 30. As illustrated in FIG. 1, the source region 40 is shallower than the cell-side well region 30. The source region 40 is disposed to be sandwiched between the outer periphery and the inner periphery of one of the cell-side well regions 30.

A p-type well contact region 35 containing p-type impurities, for example, Al is disposed in the surface layer of the drift layer 20, desirably, in the surface layer of the cell-side well region 30 that is sandwiched between the source region 40 and the first separating region 21.

Although the contour shape of the cell-side well regions 30, etc., is a square in a plan view in FIG. 2, the contour shape is not limited to such but may be another quadrilateral such as a rectangle or another polygon such as a triangle.

As illustrated in FIG. 1, a gate insulating film 50 made of, for example, silicon oxide is disposed on and across the surface of the second separating region 22, the cell-side well region 30, and a part of the source region 40.

A gate electrode 60 is disposed on the surface of the gate insulating film 50 and above the second separating region 22, the cell-side well region 30, and the ends of the source region 40 on the second separating region 22 side. A region of the cell-side well region 30 which is sandwiched between the second separating region 22 and the source region 40, which is located below the gate insulating film 50, and in which an inversion layer is formed when turned ON will be referred to as a channel region.

An interlayer insulation film 55 made of, for example, silicon oxide is disposed to cover the gate electrode 60 on the gate insulating film 50. An ohmic electrode 70 for the source is disposed on a surface of a region of the source region 40 that is not covered with the gate insulating film 50, and on a surface of a part of the well contact region 35 on the side in contact with the source region 40 to reduce the contact resistance with silicon carbide. The cell-side well region 30 can easily exchange electrons with the ohmic electrode 70 for the source through the well contact region 35 with low resistance.

The Schottky electrode 75 is disposed on the surface of the first separating region 21, and is Schottky-connected to silicon carbide of the first separating region 21. Although it is preferred that the Schottky electrode 75 covers at least the surface of the first separating region 21, it may not so. The Schottky electrode 75 is disposed at a position to be sandwiched between two portions of the ohmic electrode 70 that are separated in a cross-sectional view.

A source electrode 80 is disposed on the ohmic electrode 70 for the source, the Schottky electrode 75, and the interlayer insulation film 55. This source electrode 80 electrically short-circuits the ohmic electrode 70 for the source with the Schottky electrode 75. In other words, the ohmic electrode 70 for the source is electrically connected to the ohmic electrode 75 through the source electrode 80.

A drain electrode 85 is formed, through a rear surface ohmic electrode 73, on a second main surface opposite to the first main surface of the substrate 10, that is, on the rear surface of the substrate 10.

The unit cell structured as above is a MOSFET, and is a semiconductor switching element including a SBD. The second separating region 22 is a part of a path through which the ON current flows when the MOSFET is turned ON, whereas the first separating region 21 is a part of a path through which the unipolar current that is a freewheeling current of the SBD flows, which will be described in detail later.

Figure 3:
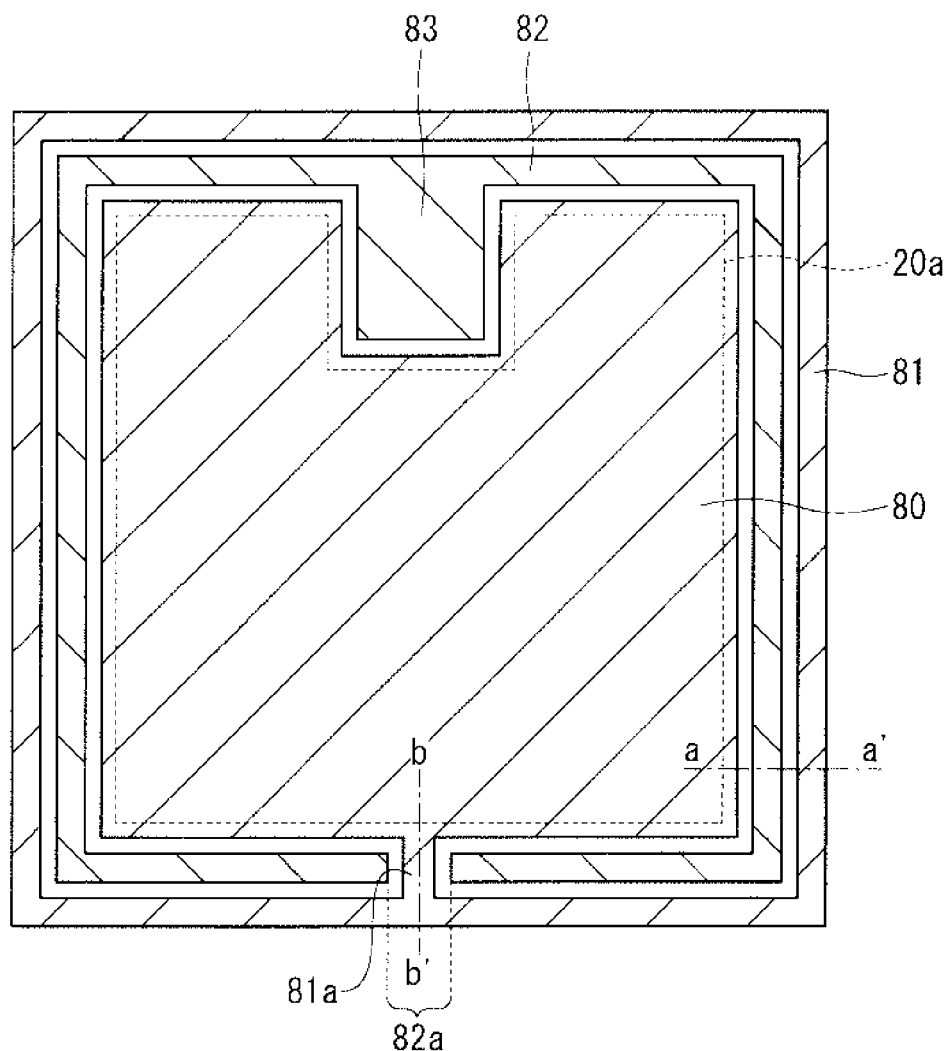
FIG. 3 is a schematic plan view illustrating an overall structure of the semiconductor device according to Embodiment 1.

FIG. 3 is a schematic plan view that is an elevated view of the overall structure of the semiconductor device according to Embodiment 1 from the upper side, that is, from the first main surface of the substrate 10. The dotted line in FIG. 3 indicates the contour line of an active region 20a, within which the unit cell described above is disposed in a plurality of portions. The source electrode 80 and the gate electrode 60 that is not illustrated in FIG. 3 are disposed to cover the active region 20a in a plan position. In other words, the source electrode 80 and the gate electrode 60 that are included in the plurality of unit cells are disposed above the active region 20a. In the present application, a region of the whole semiconductor device other than the active region 20a where the plurality of unit cells are periodically arranged will be referred to as an invalid region to be described.

As illustrated in FIG. 3, a gate line 82 electrically insulated from the source electrode 80 is disposed above the first main surface of the substrate 10. The gate line 82 surrounds the active region 20a except for an opening portion 82a that is a part of the margins of the active region 20a in a plan view. A line 81 is disposed along the gate line 82 to be opposite to the active region 20a with respect to the gate line 82 in a plan view, and is electrically connected to the source electrode 80 through the opening portion 82a. This line 81 is electrically connected to first ohmic electrodes 71 and first Schottky electrodes 76 and also to the source electrode 80, which will be described later. In the following description, a connection portion 81a will denote a portion of the line 81, the portion connecting the first ohmic electrodes 71 and the first Schottky electrodes 76 with the source electrode 80. This connection portion 81a is formed through the opening portion 82a according to Embodiment 1. The connection portion 81a and the opening portion 82a are disposed on the opposite side from a gate pad 83 connected to the gate line 82 with respect to the active region 20a.

The connection portion 81a and the opening portion 82a may be disposed in the other portions or disposed in a plurality of portions. The source electrode 80 and the line 81 may be formed from one metal line, or another metal line may be connected between the source electrode 80 and the line 81. The gate line 82 may not be disposed around the active region 20a. For example, the length of the gate line 82 may be shorter than that illustrated in FIG. 3 with the gate line 82 disposed along a part of the outer periphery of the active region 20a.

Figure 4:
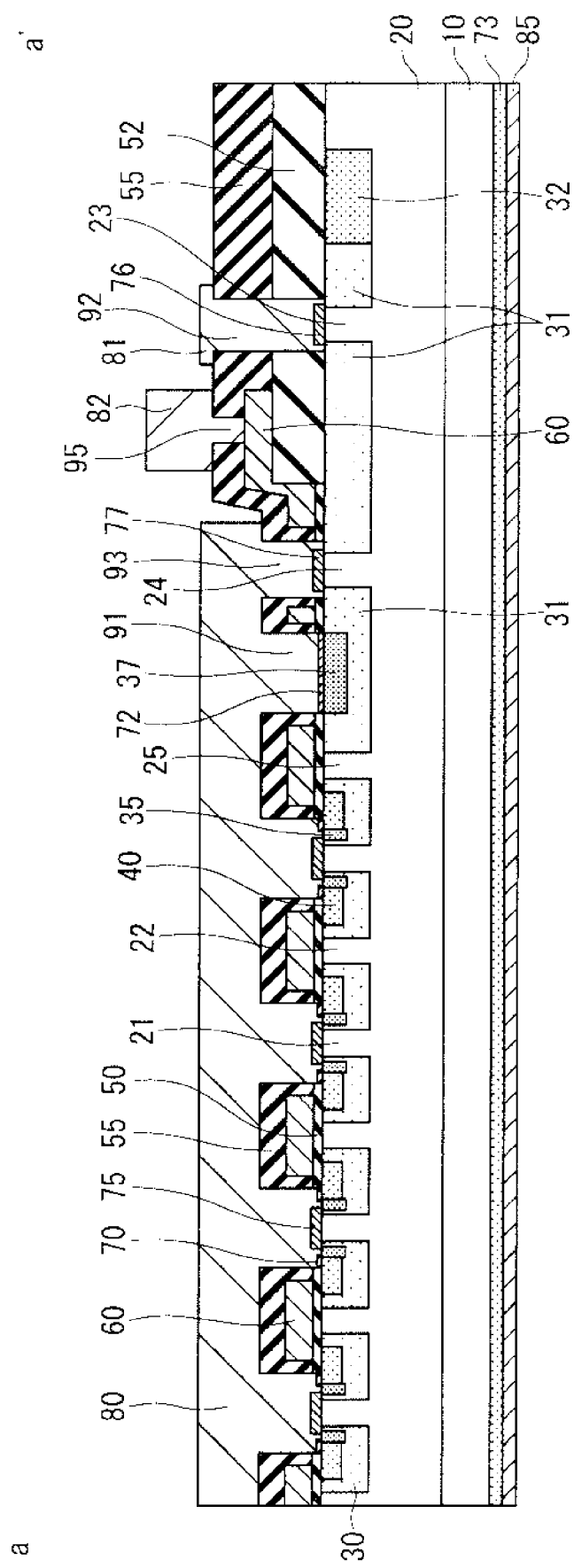
FIG. 4 is a schematic cross-sectional view illustrating the structure of the semiconductor device according to Embodiment 1.
Figure 5:
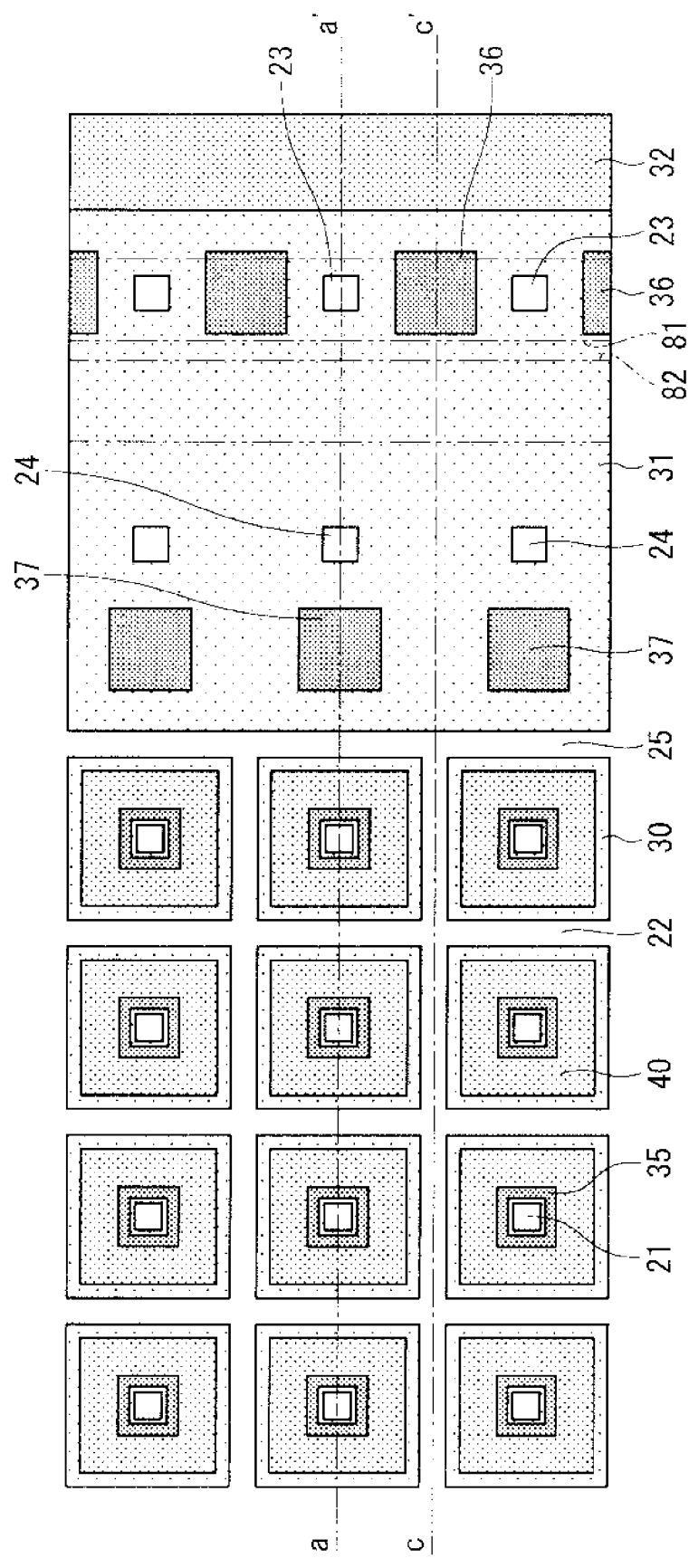
FIG. 5 is a schematic plan view illustrating the structure of the semiconductor device according to Embodiment 1.

FIG. 4 is a schematic cross-sectional view corresponding to the line a-a' in FIG. 3. FIG. 4 illustrates a structure of a termination portion of the active region 20a, that is, a structure of the gate line 82 and portions adjacent to the gate line 82 in the termination portion of a chip. FIG. 5 is a schematic plan view of the portion illustrated in FIG. 4, and mainly illustrates each of the regions disposed in the drift layer 20 that is a semiconductor layer.

Figure 6:
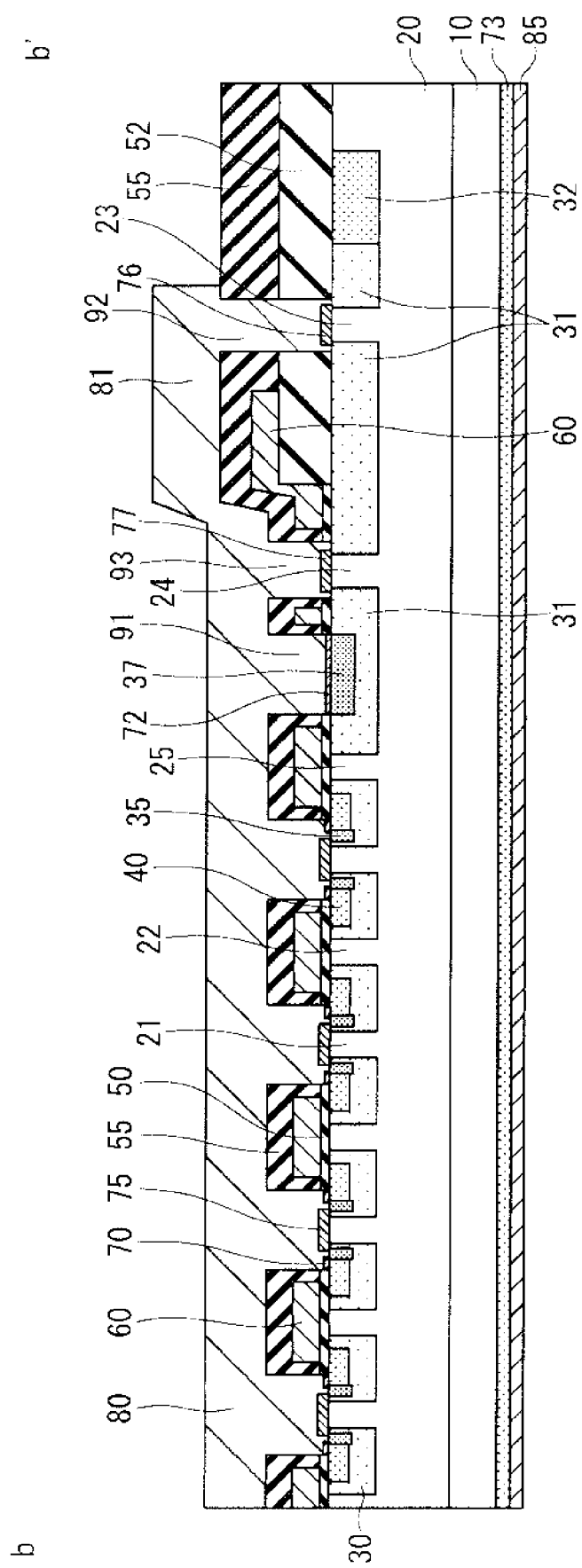
FIG. 6 is a schematic cross-sectional view illustrating the structure of the semiconductor device according to Embodiment 1.
Figure 7:
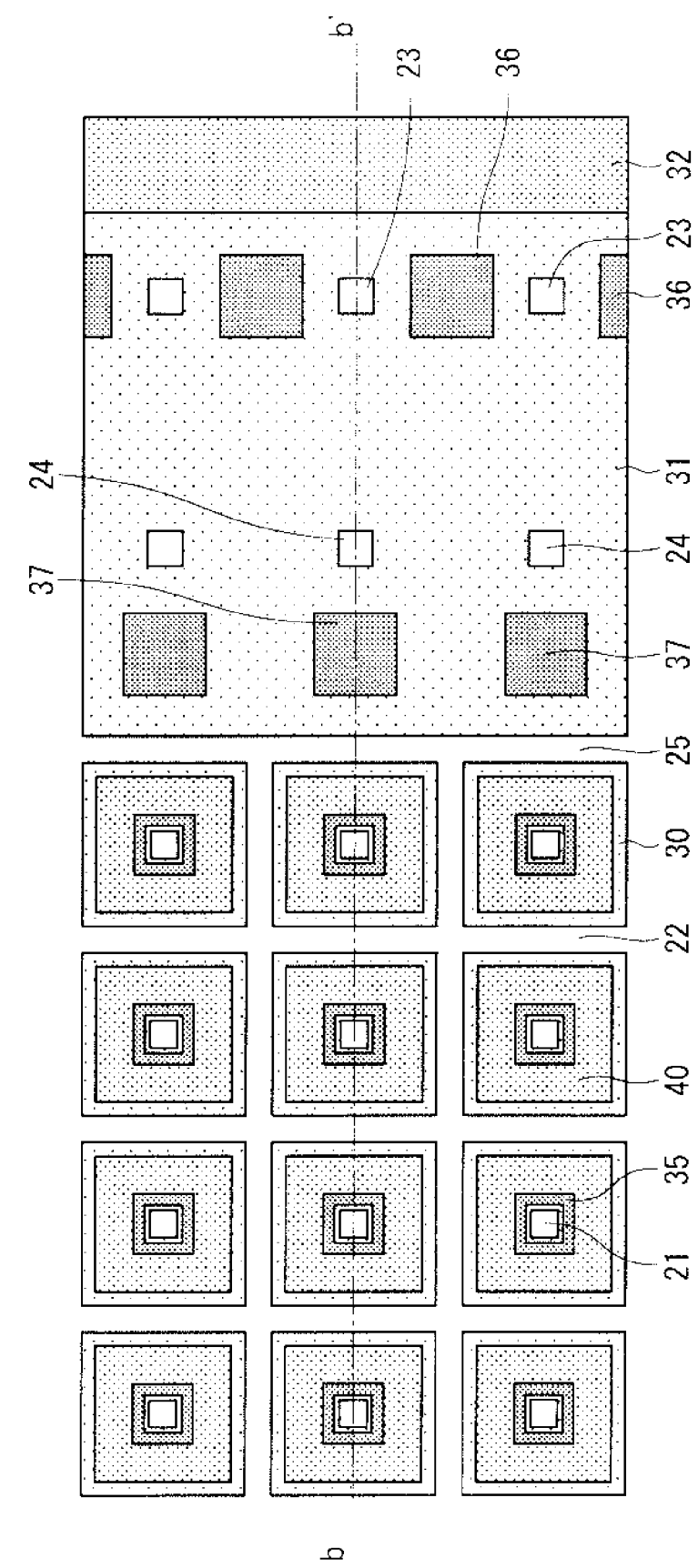
FIG. 7 is a schematic plan view illustrating the structure of the semiconductor device according to Embodiment 1.
Figure 8:
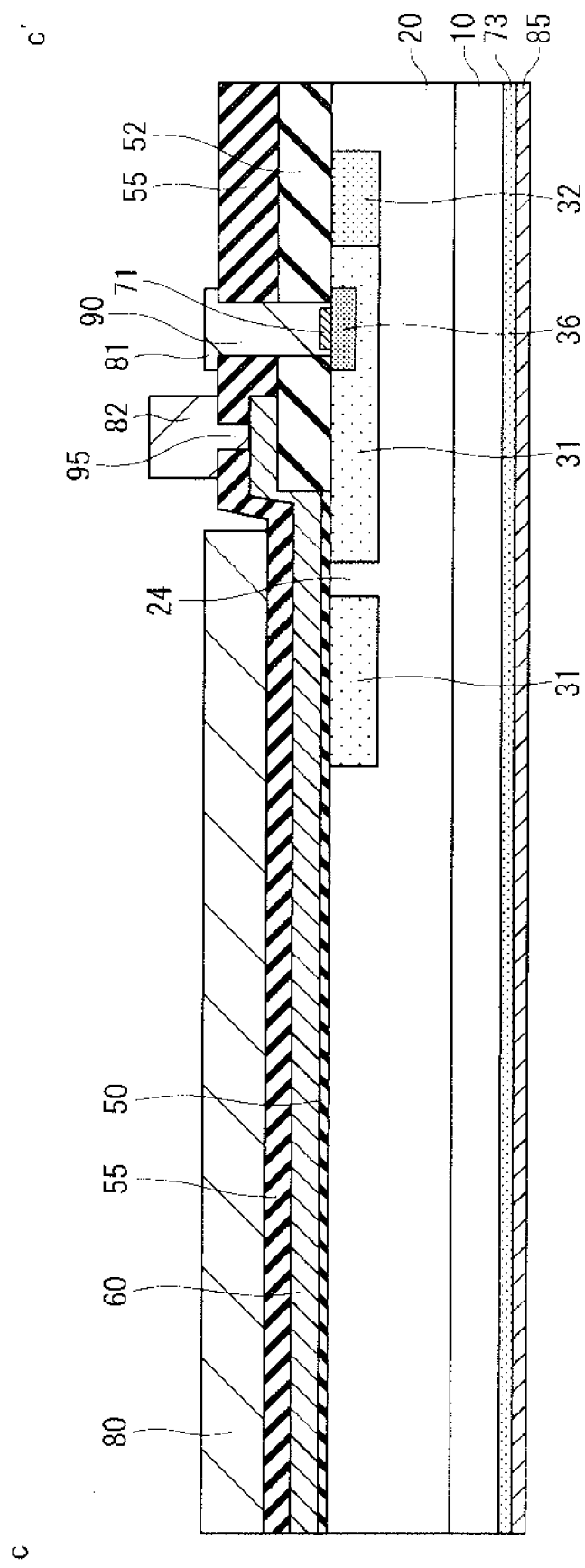
FIG. 8 is a schematic cross-sectional view illustrating the structure of the semiconductor device according to Embodiment 1.

FIG. 6 is a schematic cross-sectional view corresponding to the line b-b' in FIG. 3. FIG. 6 illustrates a structure of the termination portion of the active region 20a, that is, a structure of the opening portion 82a and portions adjacent to the opening portion 82a in the termination portion of the chip. FIG. 7 is a schematic plan view of the portion illustrated in FIG. 6, and mainly illustrates each of the regions disposed in the drift layer 20 that is a semiconductor layer. FIG. 8 is a schematic cross-sectional view illustrating a structure corresponding to the line c-c' in FIG. 5.

As illustrated in FIGS. 4 to 7, a wide-area well region 31 of p-type that is larger in area than the cell-side well regions 30 is disposed around the active region 20a to sandwich a third separating region 25 with the cell-side well regions 30 in the unit cells in the outermost circumference. The third separating region 25 is a part of the drift layer 20, and is as wide as the second separating region 22. A p-type junction termination extension (JTE) region 32 that is lower in impurity concentration than the wide-area well region 31 is disposed on the outer periphery of the wide-area well region 31 in the semiconductor device as a termination region, and is connected to the wide-area well region 31. A p-type well region including both of the wide-area well region 31 and the JTE region 32 is separated from the active region 20a in the surface layer of the drift layer 20 in a plan view, and is disposed in a portion surrounding the margins of the active region 20a. The p-type well region including both of the wide-area well region 31 and the JTE region 32 may not be disposed in the portion surrounding the margins of the active region 20a but may be, for example, disposed in proximity to a part of the margins of the active region 20a.

As illustrated in FIGS. 4 to 7, the gate line 82 is disposed above the whole region of the wide-area well region 31 and the JTE region 32. According to Embodiment 1, the gate line 82 is disposed above the wide-area well region 31 through, for example, the gate electrode 60 and the interlayer insulation film 55, and is electrically connected to the gate electrode 60 through a gate contact hole 95 opened in a part of the interlayer insulation film 55.

A second region of the well region that is on the side of the active region 20a according to Embodiment 1 is a portion of the wide-area well region 31 close to the active region 20a with respect to the gate line 82 (this portion will be hereinafter referred to as an "inner region of the wide-area well region 31"). A first region of the well region that is on the opposite side from the active region 20a according to Embodiment 1 is a combination of the JTE region 32 and a portion of the wide-area well region 31 close to the JTE region 32 with respect to the gate line 82 (this portion will be hereinafter referred to as an "outer region of the wide-area well region 31"). The present invention is not limited to the description above. For example, the gate line 82 may be disposed above both of the wide-area well region 31 and the JTE region 32 or above the JTE region 32. Accordingly, the first and second regions of the well region according to the present invention may be changed from the structures above when needed. The well region may not be divided with respect to the gate line 82.

As illustrated in FIGS. 4 and 6, the inner region of the wide-area well region 31 is ohmic-connected to the source electrode 80 through second well contact holes 91 disposed in, for example, the interlayer insulation film 55 on the inner region. Here, a second well contact region 37 and a second ohmic electrode 72 are disposed between each of the second well contact holes 91 and the inner region of the wide-area well region 31. In other words, the second ohmic electrodes 72 are disposed above the inner region of the wide-area well region 31, and are electrically connected to the inner region and also to the source electrode 80.

As illustrated in FIGS. 5 and 7, a plurality of the second well contact regions 37 are disposed along the gate line 82 in a plan view according to Embodiment 1. The area of the second well contact region 37, the area of the second ohmic electrode 72, and the area of the second well contact hole 91 almost coincide with one another in a plan view. Thus, a plurality of the second ohmic electrodes 72 and a plurality of the second well contact holes 91 are similarly disposed along the gate line 82 in a plan view.

In the interlayer insulation film 55, etc. above the inner region of the wide-area well region 31, second SBD contact holes 93 are disposed in positions more distant from the cell-side well regions 30 than the second well contact holes 91, for example, 20 μm distant. Furthermore, second exposed regions 24 that are part of the drift layer 20 are exposed at portions of the wide-area well region 31 that correspond to the second SBD contact holes 93. These second exposed regions 24 are enclosed by the wide-area well region 31, and are n-type regions resulting from the lack of p-type injection for forming the wide-area well region 31. Consequently, the second exposed regions 24 are disposed in the wide-area well region 31 to penetrate from the surface layer of the wide-area well region 31 into a depth direction.

As illustrated in FIGS. 4 and 6, a second Schottky electrode 77 is disposed on each of the second exposed regions 24 exposed at the inner region of the wide-area well region 31. These second Schottky electrodes 77 are electrically connected to the source electrode 80 through the second SBD contact holes 93. Thus, a SBD diode enclosed by the wide-area well region 31 in the invalid region is electrically connected to the source electrode 80. This SBD diode is lower in diffusion potential than a p-n junction formed in silicon carbide.

As illustrated in FIGS. 5 and 7, a plurality of the second exposed regions 24 are disposed along the gate line 82 in a plan view according to Embodiment 1. The area of the second exposed region 24, the area of the second Schottky electrode 77, and the area of the second SBD contact hole 93 almost coincide with one another in a plan view. Thus, a plurality of the second Schottky electrodes 77 and a plurality of the second SBD contact holes 93 are similarly disposed along the gate line 82 in a plan view. The second exposed regions 24, the second Schottky electrodes 77, and the second SBD contact holes 93 are disposed closer to the gate line 82 than the second well contact regions 37, the second ohmic electrodes 72, and the second well contact holes 91.

As illustrated in FIGS. 4 and 6, a field insulating film 52 thicker than the gate insulating film 50 is disposed in a position more distant from the active region 20a than from the second well contact holes 91 and the second SBD contact holes 93 in plan positions, as a layer higher than the drift layer 20 and the wide-area well region 31 and lower than the gate electrode 60.

First SBD contact holes 92 are disposed in the field insulating film 52 and the interlayer insulation film 55 on the outer region of the wide-area well region 31. First exposed regions 23 that are part of the drift layer 20 are exposed at portions of the wide-area well region 31 that correspond to the first SBD contact holes 92. These first exposed regions 23 are enclosed by the wide-area well region 31, and are n-type regions resulting from the lack of p-type injection for forming the wide-area well region 31. Consequently, the first exposed regions 23 are disposed in the wide-area well region 31 to penetrate from the surface layer of the wide-area well region 31 into a depth direction.

As illustrated in FIGS. 4 and 6, the first Schottky electrode 76 is disposed on each of the first exposed regions 23 exposed at the outer region of the wide-area well region 31. These first Schottky electrodes 76 are electrically connected to the line 81 through the first SBD contact holes 92. Since the line 81 is connected to the source electrode 80 as described above, the first Schottky electrodes 76 are also electrically connected to the source electrode 80. Thus, the SBD diode enclosed by the wide-area well region 31 in the invalid region is electrically connected to the source electrode 80. This SBD diode is lower in diffusion potential than the p-n junction formed in silicon carbide.

As illustrated in FIG. 8, the outer region of the wide-area well region 31 is ohmic-connected to the line 81 through first well contact holes 90 disposed in the field insulating film 52 and the interlayer insulation film 55 on the outer region. Here, a first well contact region 36 and the first ohmic electrode 71 are disposed between each of the first well contact holes 90 and the outer region of the wide-area well region 31. In other words, the first ohmic electrodes 71 are disposed above the outer region of the wide-area well region 31, and are electrically connected to the outer region and also to the line 81 and the source electrode 80.

As illustrated in FIGS. 5 and 7, a plurality of the first well contact regions 36 and a plurality of the first exposed regions 23 are alternately disposed along the gate line 82 in a plan view according to Embodiment 1. The area of the first well contact region 36, the area of the first ohmic electrode 71, and the area of the first well contact hole 90 almost coincide with one another in a plan view. The area of the first exposed region 23, the area of the first Schottky electrode 76, and the area of the first SBD contact hole 92 almost coincide with one another in a plan view. Thus, a plurality of the first ohmic electrodes 71 and a plurality of the first Schottky electrodes 76 are also alternately disposed along the gate line 82 in a plan view.

The first ohmic electrodes 71 and the first Schottky electrodes 76 are disposed on the wide-area well region 31 in the description above. However, the first ohmic electrodes 71 and the first Schottky electrodes 76 are not limited to such but may be disposed on the JTE region.

In the description above, silicon carbide is used as a material for a semiconductor device. However, the material is not limited to this but may be a wide bandgap material such as silicon (Si), gallium nitride (GaN), or a diamond.

[Manufacturing Method]

Next, a method for manufacturing a MOSFET including a SBD that is a semiconductor device according to Embodiment 1 will be described. The following numeric values are examples, and the present invention is not limited to such.

First, the substrate 10 whose first main surface in one plane direction is a (0001) plane is prepared. The substrate 10 has a 4H polytype, is of n-type, and is made of silicon carbide with low resistance. The drift layer 20 made of silicon carbide 5 to 50 µm thick is epitaxially grown on the first main surface of this substrate 10 with an n-type impurity concentration ranging from $1\times10^{15}$ cm$^{-3}$ to $1\times10^{17}$ cm$^{-3}$ by chemical vapor deposition (CVD).

Next, an implantation mask is formed on the surface of the drift layer 20 using, for example, a photoresist. Then, p-type impurities, for example, Al are ion-implanted to form the cell-side well regions 30 and the wide-area well region 31. Here, the depth of the ion-implanted Al approximately ranges from 0.5 µm to 3 µm, which does not exceed the thickness of the drift layer 20. The impurity concentration of the ion-implanted Al ranges from $1\times10^{17}$ cm$^{-3}$ to $1\times10^{19}$ cm$^{-3}$, which is higher than the impurity concentration of the drift layer 20. Then, the implantation mask is removed.

Next, an implantation mask is formed on the surface of the drift layer 20 using, for example, a photoresist. Then, p-type impurities, for example, Al are ion-implanted to form the JTE region 32. Here, the depth of the ion-implanted Al approximately ranges 0.5 µm to 3 µm, which does not exceed the thickness of the drift layer 20. The impurity concentration of the ion-implanted Al ranges from $1\times10^{16}$ cm$^{-3}$ to $1\times10^{18}$ cm$^{-3}$, which is higher than the impurity concentration of the drift layer 20 and lower than the Al concentration of the cell-side well regions 30. Then, the implantation mask is removed.

Next, an implantation mask is formed on the surface of the drift layer 20 using, for example, a photoresist. Then, n-type impurities, for example, N are ion-implanted to form the source regions 40. The depth of the ion-implanted N is shallower than the thickness of the cell-side well regions 30. The impurity concentration of the ion-implanted N ranges from $1\times10^{18}$ cm$^{-3}$ to $1\times10^{21}$ cm$^{-3}$, which exceeds the impurity concentration of the cell-side well regions 30. Then, the implantation mask is removed.

Next, an implantation mask is formed on the surface of the drift layer 20 using, for example, a photoresist. Then, p-type impurities, for example, Al are ion-implanted to form the well contact regions 35, the first well contact regions 36, and the second well contact regions 37. Then, the implantation mask is removed.

The well contact regions 35 are provided to obtain a favorable electrical contact with the cell-side well regions 30 and the ohmic electrodes 70 for the source. Thus, it is preferred to set the well contact regions 35 higher in p-type impurity concentration than the cell-side well regions 30. Similarly, it is preferred to set the first well contact regions 36 and the second well contact regions 37 higher in p-type impurity concentration than the wide-area well region 31. When the p-type impurities are ion implanted in the processes, the substrate 10 or the drift layer 20 is preferably heated to 150° C. or higher and then ion-implanted to reduce the resistance of, for example, the well contact regions 35.

Next, a heat treatment apparatus performs annealing in an inert gas atmosphere (1300 to 1900° C.) such as argon (Ar) gas for 30 seconds to 1 hour. This annealing electrically activates the ion-implanted first and second impurities.

Then, the field insulating film 52 made of silicon dioxide and having a thickness approximately ranging from 0.5 to 2 µm is formed in a region corresponding to the invalid region by, for example, CVD or photolithographic techniques. After formation of the field insulating film 52 on the entire surface, for example, a portion of the field insulating film 52 corresponding to the cell region, that is, the active region 20a may be removed by, for example, the photolithographic techniques or etching.

Next, the surface of silicon carbide that is not covered with the field insulating film 52 is thermally oxidized to form silicon oxide to be the gate insulating film 50 with a desired thickness. Then, a polycrystalline silicon film having conductivity is formed on the gate insulating film 50 by low pressure CVD, and is patterned to form the gate electrode 60. Then, the interlayer insulation film 55 is formed by low pressure CVD. Next, contact holes are formed to penetrate the interlayer insulation film 55 and the gate insulating film 50 and reach the well contact regions 35 and the source regions 40. Simultaneously, the first well contact holes 90 and the second well contact holes 91 are formed.

After formation of a metal film that mainly contains Ni by, for example, sputtering, this film is thermally treated at a temperature ranging from 600 to 1100° C. Then, the metal film that mainly contains Ni is reacted with the silicon carbide layer in the contact holes to form silicide between the silicon carbide layer and the metal film. Then, the remaining metal film on the interlayer insulation film 55 other than the formed silicide is removed by wet-etching. Consequently, the ohmic electrodes 70, the first ohmic electrodes 71, and the second ohmic electrodes 72 are formed.

Subsequently, a metal that mainly contains Ni is formed on the rear surface that is the second main surface of the substrate 10 and is thermally treated to form the rear surface ohmic electrode 73 on the rear surface of the substrate 10.

Next, portions to be the first separating regions 21 and its surrounding upper portions, the first SBD contact holes 92, and the second SBD contact holes 93 are removed from the interlayer insulation film 55 and the gate insulating film 50 by patterning using, for example, a photoresist. At the same time, a portion to be the gate contact hole 95 is removed from the interlayer insulation film 55 by patterning using, for example, a photoresist. The removing method is preferably wet-etching that does not damage the surface of silicon carbide to be the interface of an SBD.

Next, the Schottky electrodes 75, the first Schottky electrodes 76, and the second Schottky electrodes 77 are formed through deposition by, for example, sputtering. For example, titanium (Ti), molybdenum (Mo), and nickel (Ni) are preferably used as materials for the Schottky electrodes 75.

Then, a wiring metal made of, for example, Al is formed by sputtering or vapor deposition on the surface of the substrate 10 that is being processed so far, and is patterned by the photolithographic techniques to form the source electrode 80, the line 81, and the gate line 82 that are connected to one another. Here, the source electrode 80 is in contact with the ohmic electrodes 70, the second ohmic electrodes 72, the Schottky electrodes 75, and the second Schottky electrodes 77. The line 81 is in contact with the first ohmic electrodes 71 and the first Schottky electrodes 76. The gate line 82 is in contact with the gate electrode 60.

Further, the drain electrode 85 that is a metal film is formed on a surface of the rear surface ohmic electrode 73 that is formed on the rear surface of the substrate 10, thus completing the semiconductor devices illustrated in FIGS. 1 to 8.

[Operations]

Next, operations of the MOSFET including the SBD that is a semiconductor device according to Embodiment 1 will be divided into three states and simply described.

The first state is a state where a higher voltage is applied to the drain electrode 85 than to the source electrode 80 and a positive voltage higher than or equal to a threshold is applied to the gate electrode 60. This state will be hereinafter referred to as an "ON state".

In this ON state, a channel region is formed in the cell-side well region 30 near the gate electrode 60, and a path through which electrons that are carriers flow is formed between the source region 40 of n-type and the second separating region 22 of n-type. Since an electric field oriented in a direction in which a current hardly flows at a Schottky junction is applied to the included SBD, that is, an electric field oriented in an opposite direction (a reverse bias) is applied to the SBD, the current will not flow through the SBD.

The electrons flowing from the source electrode 80 to the drain electrode 85 start from the source electrode 80 and reaches the drain electrode 85 through the ohmic electrodes 70, the source regions 40, the channel regions, the second separating regions 22, the drift layer 20, and the substrate 10 in accordance with the electric field formed by the positive voltage applied to the drain electrode 85.

Thus, application of the positive voltage to the gate electrode 60 allows the ON current to flow from the drain electrode 85 to the source electrode 80. Here, the voltage to be applied between the source electrode 80 and the drain electrode 85 will be referred to as an ON voltage, and a value obtained by dividing the ON voltage by a density of the ON current will be referred to as an ON resistance. The ON resistance is equal to a sum of resistances in a path through which the electrons flow. Since a product of the ON resistance and the square of the ON current is equal to the conduction loss to be consumed when the MOSFET is energized, the ON resistance is preferably low. The ON current flows only through the active region 20a with the channel, and does not flow through the invalid region.

The second state is a state where a voltage higher than the voltage of the source electrode 80 is applied to the drain electrode 85 and a voltage lower than or equal to the threshold is applied to the gate electrode 60. This state will be hereinafter referred to as an "OFF state".

Although the ON current does not flow due to no formation of the channel region in the cell-side well region 30 in this OFF state, a high voltage is applied between the source electrode 80 and the drain electrode 85 of the MOSFET similarly as in the ON state. Here, since the voltage of the gate electrode 60 is almost equal to the voltage of the source electrode 80, a high voltage is also applied between the gate electrode 60 and the drain electrode 85.

In the active region 20a, a reverse bias is applied to the p-n junction to be formed between the cell-side well regions 30 and the drift layer 20, and a thick depletion layer spreads toward the drift layer 20 with a relatively low concentration. The spread of the depletion layer can prevent the high voltage from being applied to the gate insulating film 50.

Since the second separating regions 22 located directly underneath the gate insulating film 50 are not of p-type, a relatively higher electric field is applied to the gate insulating film 50 on the second separating regions 22 than to the gate insulating film 50 on the cell-side well regions 30. However, appropriately designing the width of the second separating regions 22 can reduce the electric field to be applied to the gate insulating film 50 on the second separating regions 22 less than or equal to a desired value, using the depletion layer extending from the cell-side well regions 30 to the second separating regions 22 in the lateral direction.

Since a thin depletion layer also spreads over not only the drift layer 20 and the second separating regions 22 but also the cell-side well regions 30 of p-type that have a relatively high concentration, positive holes occur from the depletion layer formed in the cell-side well regions 30 in a process of shifting to the OFF state. However, the semiconductor device structured as above enables these positive holes to be ejected to the source electrode 80 through the well contact regions 35. In other words, formation of the electrical contact between the cell-side well regions 30 and the source electrode 80 through the well contact regions 35 can reduce the voltage to be applied to the gate insulating film 50 on the cell-side well regions 30 in the OFF state.

Further, depletion of the wide-area well region 31 and a part of the JTE region 32 as well as the drift layer 20 in the invalid region of a termination region of a chip illustrated in FIGS. 4 to 8 relaxes the electric field concentration in an element termination portion and suppresses decrease in the breakdown voltage. Here, the positive holes occurring in the depletion layer of the wide-area well region 31 and the JTE region 32 are ejected to the source electrode 80 through the first ohmic electrodes 71 and the first well contact holes 90 that are the nearest to the depletion layer or through the second ohmic electrodes 72 and the second well contact holes 91 that are the nearest to the depletion layer.

Since the electric field in the same direction as that of the "ON state" is applied to the included SBD, no current ideally flows. However, since the electric field applied to the SBD in the "OFF state" is higher than that in the "ON state", the leakage current may be generated.

As the leakage current is larger, the heat generated in the MOSFET may increase, and the MOSFET and a module including the MOSFET may thermally break down. Thus, the electric field to be applied to a Schottky junction is preferably reduced to reduce the leakage current.

The third state is a state where a voltage lower than that of the source electrode 80 is applied to the drain electrode 85, that is, a state where a counter electromotive voltage is applied to the MOSFET, and is a state where a freewheeling current flows from the source electrode 80 to the drain electrode 85. This state will be hereinafter referred to as a "freewheeling state".

Since a forward electric field (a forward bias) is applied to the included SBDs in this freewheeling state, a unipolar current that is an electron current flows from the Schottky electrodes 75 to the silicon carbide layer. When the voltage of the source electrode 80 is little higher than that of the drain electrode 85, that is, when the source-to-drain voltage is low, the freewheeling current flows through all the included SBDs. Thus, the minority carriers are not injected into the drift layer 20. Thus, the crystal defects do not occur, and the ON resistance does not increase.

When the source-to-drain voltage is higher than the operating voltage of the SBDs and is lower than or equal to the operating voltage of the p-n diode, a voltage drop corresponding to a product of the resistivity and the current density occurs across the drift layer 20 that is a part of the energizing path, during flow of the unipolar current through the SBDs between the source and the drain. Consequently, since the potential of the contact surface of the drift layer 20 with respect to the cell-side well regions 30 becomes lower than the source-to-drain voltage, the source-to-drain voltage with which the p-n diode operates can be increased. As a result, a larger amount of the unipolar current can be passed as the freewheeling current until the operation of the p-n diode.

In the semiconductor devices illustrated in FIGS. 4 to 8 according to Embodiment 1, SBDs (may be referred to as "invalid-region SBDs") are formed in the first exposed regions 23 and the second exposed regions 24 near the first well contact holes 90 and the second well contact holes 91, respectively. When the source-to-drain voltage is larger than the diffusion potential of the SBDs, a current flows from the invalid-region SBDs toward the silicon carbide layer.

Since this current diffuses in the drift layer 20 in the lateral direction, a voltage drop occurs not only directly underneath the first SBD contact holes 92 and the second SBD contact holes 93 but also in the first well contact holes 90 and the second well contact holes 91 near the invalid-region SBDs and in the drift layer 20 and the substrate 10 near the region under the gate line 82. As a result, a voltage to be applied to the p-n junction decreases by the voltage drop near the region with the first SBD contact holes 92 and the second SBD contact holes 93. Thus, the source-to-drain voltage with which a bipolar operation is performed in the unit cells around the invalid region can be increased more.

In contrast, there is little expectation for producing, at a p-n junction portion between the wide-area well region 31 and the drift layer 20 at which the diffused SBD current does not sufficiently arrive, an advantage of reducing the bipolar operation of a p-n diode including the p-n junction portion with the SBD current. However, since the sheet resistance of the wide-area well region 31 between the plan position of the p-n junction and the plan position of the invalid-region SBD functions as a parasitic resistance, the current flowing through the p-n diode will be restricted to a small value.

In the semiconductor device according to Embodiment 1, the invalid-region SBDs are disposed directly underneath the first SBD contact holes 92 and the second SBD contact holes 93 in the invalid region, which indicates that the number of the invalid-region SBDs is relatively many. Since the area at which the diffused SBD current does not sufficiently arrive can be reduced, the current flowing through the p-n diode can be further reduced.

Moreover, the energy difference in silicon carbide between the upper edge of valence band and the impurity level of acceptor is large, and the sheet resistance of a p-type well region is generally higher than the sheet resistance of silicon approximately by three orders of magnitude due to the influence such as a small ionization rate. Thus, the semiconductor device made of silicon carbide according to Embodiment 1 can further increase the advantage of reducing the current flowing through the p-n diode.

As a result, the holes reaching the drift layer 20 in the active region 20a from the p-n junction portion between the wide-area well region 31 and the drift layer 20 can be significantly reduced. Thus, a larger amount of the freewheeling current can be passed over the whole chip until the active region 20a near the termination region starts the bipolar operation.

[Advantages]

The semiconductor device according to Embodiment 1 includes: the drift layer 20 that is a semiconductor layer of a first conductivity type; a plurality of unit cells that are a plurality of semiconductor switching elements; the wide-area well region 31 and the JTE region 32 that form a well region of a second conductivity type; the gate line 82; the first ohmic electrode 71; the first Schottky electrode 76; and the line 81.

The plurality of unit cells are disposed in the active region 20a that is a predefined region, in the drift layer 20, and include the source electrode 80 and the gate electrode 60 that are disposed above the active region 20a. The plurality of unit cells are a plurality of MOSFETs, and each include a Schottky barrier diode.

The wide-area well region 31 and the JTE region 32 are disposed separate from the active region 20a in a plan view, and are included in the surface layer of the drift layer 20.

The gate line 82 is electrically connected to the gate electrode 60. The gate line 82 is disposed above the wide-area well region 31.

The first ohmic electrode 71 is disposed above the outer region of the wide-area well region 31, and is electrically connected to the outer region, the first region being on the opposite side from the active region 20a.

The first Schottky electrode 76 is disposed on the drift layer 20 exposed at the outer region of the wide-area well region 31.

This line 81 is electrically connected to the first ohmic electrode 71 and the first Schottky electrode 76, and also to the source electrode 80.

Since the first ohmic electrode 71 disposed in the outer region of the wide-area well region 31 is electrically connected to the source electrode 80 through the line 81 in the semiconductor device according to Embodiment 1, rise in the potential of well under the gate line 82 can be reduced even if the displacement current flows in the switching operation. Consequently, a breakdown in a gate insulating film such as a gate oxide film can be reduced.

The first Schottky electrode 76 and the second Schottky electrode 77 are disposed on the wide-area well region 31 according to Embodiment 1. Since the first Schottky electrode 76 and the second Schottky electrode 77 can cause a voltage drop in a freewheeling state, a voltage to be applied to a SBD included in the cell-side well region 30 near the wide-area well region 31 can be relaxed. Since a larger amount of the current can be freewheeled in the SBD, the operations of the p-n diode can be reduced. Since the freewheeling current that can flow through the whole chip with the unipolar current increases, the chip size can also be reduced.

Thus, the first ohmic electrodes 71 and the first Schottky electrodes 76 are alternately disposed along the gate line 82 in a plan view according to Embodiment 1. Such a structure can suppress an increase in the chip size due to disposition of the first ohmic electrode 71.

Embodiment 2

Figure 9:
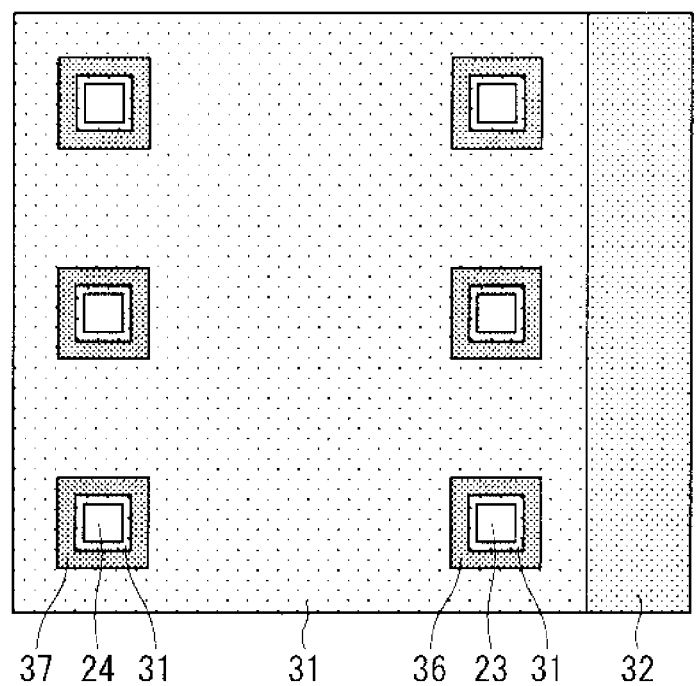
FIG. 9 is a schematic plan view illustrating a structure of a semiconductor device according to Embodiment 2.

FIG. 9 is a schematic plan view illustrating a structure of a semiconductor device according to Embodiment 2, specifically, a schematic plan view illustrating a structure of the wide-area well regions 31 and the JTE region 32 similarly as FIGS. 5 and 7. Among constituent elements to be described in Embodiment 2, the constituent elements identical or similar to those in Embodiment 1 will be denoted by the same reference numerals, and the different constituent elements will be hereinafter mainly described.

In Embodiment 2, the first well contact regions 36 are disposed around the first exposed regions 23 in a plan view, and both end portions of the first well contact region 36 sandwich the first exposed region 23 through a part of the wide-area well region 31. Thus, the first ohmic electrodes 71 are disposed around the first Schottky electrodes 76 in a plan view. Since such a structure enables integration of the first well contact holes 90 and the first SBD contact holes 92, the chip size can be reduced.

Similarly in Embodiment 2, the second well contact regions 37 are disposed around the second exposed regions 24 in a plan view, and both end portions of the second well contact region 37 sandwich the second exposed region 24 through a part of the wide-area well region 31. Thus, the second ohmic electrodes 72 are disposed around the second Schottky electrodes 77 in a plan view. Since such a structure enables integration of the second well contact holes 91 and the second SBD contact holes 93, the chip size can be reduced.

Here, both structures of disposing the first ohmic electrodes 71 around the first Schottky electrodes 76 in a plan view and disposing the second ohmic electrodes 72 around the second Schottky electrodes 77 in a plan view are provided. However, the structures are not limited to such but only one of these two structures may be provided.

Embodiments can be freely combined, and appropriately modified or omitted within the scope of the invention.

Although the present invention has been described in detail, the description is in all aspects illustrative and does not restrict the present invention. Therefore, numerous modifications that have not yet been exemplified will be devised without departing from the scope of the present invention.

EXPLANATION OF REFERENCE SIGNS 20 drift layer, 20a active region, 23 first exposed region, 24 second exposed region, 31 wide-area well region, 32 JTE region, 60 gate electrode, 71 first ohmic electrode, 72 second ohmic electrode, 76 first Schottky electrode, 77 second Schottky electrode, 80 source electrode, 81 line, 81a connection portion, 82 gate line, 83 gate pad.

The invention claimed is:

1. A semiconductor device, comprising:
a semiconductor layer of a first conductivity type;
a plurality of semiconductor switching elements disposed in a predefined region, in the semiconductor layer, the plurality of semiconductor switching elements being a plurality of metal-oxide-semiconductor field-effect-transistors (MOSFETs) including a source electrode and a gate electrode that are disposed above the predefined region, the plurality of semiconductor switching elements each including a Schottky barrier diode;
a well region of a second conductivity type that is disposed separate from the predefined region in a plan view, the well region being included in a surface layer of the semiconductor layer;
a gate line disposed above the well region and electrically connected to the gate electrode;
a first ohmic electrode disposed above a first region of the well region and electrically connected to the first region, the first region being on the opposite side from the predefined region;
a first Schottky electrode disposed on the semiconductor layer exposed at the first region of the well region; and
a line electrically connected to the first ohmic electrode, the first Schottky electrode, and the source electrode,
wherein the first ohmic electrode and the first Schottky electrode are alternately disposed along the gate line in a plan view.

2. The semiconductor device according to claim 1, wherein a connection portion for connecting the first ohmic electrode and the first Schottky electrode with the source electrode is disposed on the opposite side from a gate pad connected to the gate line with respect to the predefined region, the connection portion being a portion of the line.

3. The semiconductor device according to claim 1, further comprising:
a second Schottky electrode disposed on the semiconductor layer exposed at a second region of the well region and electrically connected to the source electrode, the second region being on the side of the predefined region.

4. The semiconductor device according to claim 3, further comprising:
a second ohmic electrode disposed above the second region of the well region and electrically connected to the second region and the source electrode.

5. The semiconductor device according to claim 4, wherein the second Schottky electrode is disposed closer to the gate line than the second ohmic electrode.

6. The semiconductor device according to claim 4, wherein the second ohmic electrode is disposed around the second Schottky electrode in a plan view.

7. The semiconductor device according to claim 1, wherein the semiconductor layer is a silicon carbide layer.

8. A semiconductor device, comprising:
a semiconductor layer of a first conductivity type;
a plurality of semiconductor switching elements disposed in a predefined region, in the semiconductor layer, the plurality of semiconductor switching elements being a plurality of metal-oxide-semiconductor field-effect-transistors (MOSFETs) including a source electrode and a gate electrode that are disposed above the predefined region, the plurality of semiconductor switching elements each including a Schottky barrier diode;
a well region of a second conductivity type that is disposed separate from the predefined region in a plan view, the well region being included in a surface layer of the semiconductor layer;
a gate line disposed above the well region and electrically connected to the gate electrode;
a first ohmic electrode disposed above a first region of the well region and electrically connected to the first region, the first region being on the opposite side from the predefined region;
a first Schottky electrode disposed on the semiconductor layer exposed at the first region of the well region; and
a line electrically connected to the first ohmic electrode, the first Schottky electrode, and the source electrode,
wherein the first ohmic electrode is disposed around the first Schottky electrode in a plan view.

9. The semiconductor device according to claim 8, wherein a connection portion for connecting the first ohmic electrode and the first Schottky electrode with the source electrode is disposed on the opposite side from a gate pad connected to the gate line with respect to the predefined region, the connection portion being a portion of the line.

10. The semiconductor device according to claim 8, further comprising
a second Schottky electrode disposed on the semiconductor layer exposed at a second region of the well region and electrically connected to the source electrode, the second region being on the side of the predefined region.

11. A semiconductor device, comprising:
a semiconductor layer of a first conductivity type;
a plurality of semiconductor switching elements disposed in a predefined region, in the semiconductor layer, the plurality of semiconductor switching elements being a plurality of metal-oxide-semiconductor field-effect-transistors (MOSFETs) including a source electrode and a gate electrode that are disposed above the predefined region, the plurality of semiconductor switching elements each including a Schottky barrier diode;
a well region of a second conductivity type that is disposed separate from the predefined region in a plan view, the well region being included in a surface layer of the semiconductor layer;
a gate line disposed above the well region and electrically connected to the gate electrode;
a first ohmic electrode disposed above a first region of the well region and electrically connected to the first region, the first region being on the opposite side from the predefined region;
a first Schottky electrode disposed on the semiconductor layer exposed at the first region of the well region; and
a line electrically connected to the first ohmic electrode, the first Schottky electrode, and the source electrode,
wherein a connection portion for connecting the first ohmic electrode and the first Schottky electrode with the source electrode is disposed on the opposite side from a gate pad connected to the gate line with respect to the predefined region, the connection portion being a portion of the line.

12. The semiconductor device according to claim 11, further comprising
a second Schottky electrode disposed on the semiconductor layer exposed at a second region of the well region and electrically connected to the source electrode, the second region being on the side of the predefined region.

* * * * *